United States Patent
Noguchi

(10) Patent No.: US 11,519,096 B2
(45) Date of Patent: Dec. 6, 2022

(54) PEDESTAL FOR SUPPORTING A SEED FOR SIC SINGLE CRYSTAL GROWTH WHICH INCLUDES A GAS-PERMEABLE REGION OF REDUCED THICKNESS

(71) Applicant: SHOWA DENKO K.K., Tokyo (JP)

(72) Inventor: Shunsuke Noguchi, Hikone (JP)

(73) Assignee: SHOWA DENKO K.K., Tokyo (JP)

( * ) Notice: Subject to any disclaimer, the term of this patent is extended or adjusted under 35 U.S.C. 154(b) by 0 days.

(21) Appl. No.: 16/512,669

(22) Filed: Jul. 16, 2019

(65) Prior Publication Data

US 2020/0024769 A1    Jan. 23, 2020

(30) Foreign Application Priority Data

Jul. 18, 2018 (JP) .............................. JP2018-135092

(51) Int. Cl.
| | |
|---|---|
| *C30B 35/00* | (2006.01) |
| *C30B 25/12* | (2006.01) |
| *C23C 16/458* | (2006.01) |
| *C23C 16/32* | (2006.01) |
| *C30B 29/36* | (2006.01) |

(52) U.S. Cl.
CPC ............ *C30B 25/12* (2013.01); *C23C 16/325* (2013.01); *C23C 16/4583* (2013.01); *C30B 29/36* (2013.01); *C30B 35/002* (2013.01)

(58) Field of Classification Search
CPC ..... C30B 23/00; C30B 23/002; C30B 23/005; C30B 23/02; C30B 23/06; C30B 23/063; C30B 29/00; C30B 29/10; C30B 29/36; C30B 35/00; C30B 35/002; C30B 25/12; C23C 16/325; C23C 16/4583

USPC ... 117/84, 88, 101–102, 106, 200, 204, 911, 117/937, 951

See application file for complete search history.

(56) References Cited

U.S. PATENT DOCUMENTS

| | | | | |
|---|---|---|---|---|
| 2010/0028240 | A1* | 2/2010 | Shonai | C30B 35/002 423/345 |
| 2011/0308449 | A1* | 12/2011 | Katsuno | C30B 23/005 117/84 |
| 2012/0325150 | A1* | 12/2012 | Seki | C30B 23/06 118/726 |
| 2014/0299048 | A1* | 10/2014 | Sasaki | C30B 23/002 117/84 |

FOREIGN PATENT DOCUMENTS

| | | |
|---|---|---|
| CN | 101553604 A | 10/2009 |
| CN | 101985773 A | 3/2011 |
| CN | 102308031 A | 1/2012 |

(Continued)

OTHER PUBLICATIONS

Communication dated Dec. 17, 2020, issued by the State Intellectual Property Office of the People's Republic of China in Chinese Application No. 201910627951.4.

(Continued)

*Primary Examiner* — Kenneth A Bratland, Jr.
(74) *Attorney, Agent, or Firm* — Sughrue Mion, PLLC

(57) ABSTRACT

A pedestal 103 of the present invention is a pedestal 103 for a seed 102 for crystal growth, in which one main surface 103a to which the seed 102 adheres is flat, and the pedestal has a gas-permeable region 106 which a thickness from the one main surface 103a that is formed to be locally thin.

8 Claims, 5 Drawing Sheets

(56) References Cited

FOREIGN PATENT DOCUMENTS

| CN | 102471930 A |   | 5/2012  |
|----|-------------|---|---------|
| CN | 102713028 A |   | 10/2012 |
| JP | 11-278985 A |   | 10/1999 |
| JP | 11278985 A  | * | 10/1999 |
| JP | 2008-044802 A |   | 2/2008  |
| JP | 2008-088036 A |   | 4/2008  |
| JP | 2008-290889 A |   | 12/2008 |
| JP | 2010-202485 A |   | 9/2010  |
| JP | 2011-144082 A |   | 7/2011  |
| JP | 2011-207691 A |   | 10/2011 |
| JP | 2013-071870 A |   | 4/2013  |
| JP | 2014-201498 A |   | 10/2014 |
| JP | 2015-120605 A |   | 7/2015  |
| JP | 2015-131744 A |   | 7/2015  |
| JP | 2015-193494 A |   | 11/2015 |

OTHER PUBLICATIONS

Office Action dated Apr. 26, 2021 in Chinese Application No. 201910627951.4.
Office Action dated Dec. 21, 2021 from the Japanese Patent Office in JP Application No. 2018-135092.

* cited by examiner

PEDESTAL FOR SUPPORTING A SEED FOR SIC SINGLE CRYSTAL GROWTH WHICH INCLUDES A GAS-PERMEABLE REGION OF REDUCED THICKNESS

BACKGROUND OF THE INVENTION

Field of the Invention

The present invention relates to a pedestal that supports a seed for growing a SiC single crystal (a seed crystal) and a SiC single crystal manufacturing apparatus having the same and manufacturing method.

Priority is claimed based on Japanese Patent Application No. 2018-135092, filed Jul. 18, 2018, the content of which is incorporated herein by reference.

Description of Related Art

Silicon carbide (SiC), which is a semiconductor material, is known as having a wider band gap and higher voltage resistance and thermal conductivity than silicon (Si) that has recently been used widely for device substrates. Thus, silicon carbide is expected to be applied to power semiconductor devices, high-frequency devices, high-temperature operating devices, and the like.

SiC epitaxial wafers obtained by forming epitaxial films on SiC wafers have been used for semiconductor devices in which silicon carbide is used. The epitaxial films provided on the SiC wafers using chemical vapor deposition (CVD) serve as active areas of SiC semiconductor devices. The active areas of the epitaxial films are affected by the quality of the SiC wafers since they directly inherit crystal defects of the SiC wafers or convert the crystal defects into other crystal defects and inherit them. For this reason, high-quality SiC wafers with few defects are required.

A SiC wafer is produced by cutting an ingot of a SiC single crystal. A SiC single crystal can be manufactured generally using a sublimation method. The sublimation method is a method in which a seed crystal (seed) formed of a SiC single crystal is disposed on a pedestal placed inside a crucible made of graphite, the crucible is heated to supply a sublimation gas sublimated from material powder inside the crucible to the seed crystal, and the seed crystal grows into a larger SiC single crystal. In the process of growth of the SiC single crystal, the seed crystal is fixed to the pedestal using an adhesive. For the adhesive, a carbon adhesive including an organic solvent is often used (Japanese Unexamined Patent Application First Publication No. 2015-193494).

SUMMARY OF THE INVENTION

In the process of curing of the adhesive, a gas may be generated from the heated carbon adhesive. In a case where a vacancy is formed between the pedestal and the seed crystal due to the gas, a macro defect (penetration defect) expands therefrom and reaches the growing SiC single crystal. Thus, the growing SiC single crystal and seed may have deteriorating adhesiveness to the pedestal and thus may be detached therefrom. Even if the growing SiC single crystal is not detached from the pedestal, the grown SiC single crystal may include macro defects, which causes degradation of the quality.

If a seed crystal having a small diameter is used, a gas can be allowed to escape from a side being not covered by the seed to the outside by pressing the seed with a weight put thereon or performing a vacuum pressure deforming treatment thereon before it grows to a SiC single crystal. However, when SiC wafers having a large diameter are to be manufactured to meet the recent demand, a seed crystal having a large diameter is used accordingly, and in that case, it is difficult to make a gas generated near the center of the adhesive layer to be removed from a side of the adhesive layer.

The present invention takes the above-described circumstances into consideration and aims to provide a pedestal from which gas generated from a heated adhesive can be removed in a state in which a seed is fixed to a pedestal using an adhesive.

Means for Solving Problems (1) A pedestal according to an aspect of the present invention is a pedestal supporting a seed for crystal growth, in which one main surface to which the seed adheres is flat and the pedestal has a gas-permeable region which a thickness from the one main surface is formed to be locally thin.

(2) In the pedestal described in (1) above, a thickness of the gas-permeable region is preferably 1 mm or more and less than 5 mm.

(3) In the pedestal described in any one of (1) and (2) above, the thickness of the gas-permeable region preferably increases as a position separates from a center of the gas-permeable region along the one main surface.

(4) In the pedestal described in any one of (1) to (3) above, the region other than the gas-permeable region preferably includes a part having a thickness of 10 mm or more.

(5) In the pedestal described in any one of (1) to (4) above, in plan view from a thickness direction, when a distance from the center to an outer circumference is set to r, the gas-permeable region is preferably included in the range of the distance r/2 from the center.

(6) A pedestal according to another aspect of the present invention is a pedestal supporting a seed for crystal growth, in which the one main surface to which the seed adheres is flat, the pedestal has a gas-permeable region which is spreading in a depth direction from the one main surface and has a space communicating with the outside and provided on an inner side of the gas-permeable region.

(7) In the pedestal described in (6) above, the space is preferably formed at a distance of 1 mm or more to less than 5 mm from the one main surface.

(8) A SiC single crystal manufacturing apparatus according to an aspect of the present invention has the pedestal described in any one of (1) to (7) above.

(9) A SiC single crystal manufacturing method according to an aspect of the present invention is a SiC single crystal manufacturing method for manufacturing a SiC single crystal using the pedestal described in any one of (1) to (7) above and includes a step of adhering the seed on the one main surface of the pedestal using an adhesive and then pressing the seed to the pedestal side in a heating step for curing the adhesive.

(10) The SiC single crystal manufacturing method described in (9) above preferably has a step of filling a concavity formed on the pedestal after the heating step.

The pedestal of the present invention has a gas-permeable region that is formed to be locally thin. Thus, in a state in which a seed is fixed to the pedestal by an adhesive, a gas generated from the adhesive when the adhesive is heated and cured can be removed by being emitted to the outside via the gas-permeable region.

DETAILED DESCRIPTION OF THE INVENTION

The present invention will be described below in detail by appropriately referring to the appended drawings. The drawings used in the following description illustrate the characteristic parts in enlarged forms for the sake of convenience to make it easier to understand features of the present invention, and dimensional ratios and the like between each of the constituent components may be different from those in real components. In addition, although materials, dimensions, and the like exemplified in the following description are merely examples, the present invention is not limited thereto, and the invention can be implemented by appropriately changing them in a scope in which the effects of the present invention can be exhibited.

First Embodiment

Figure 1:
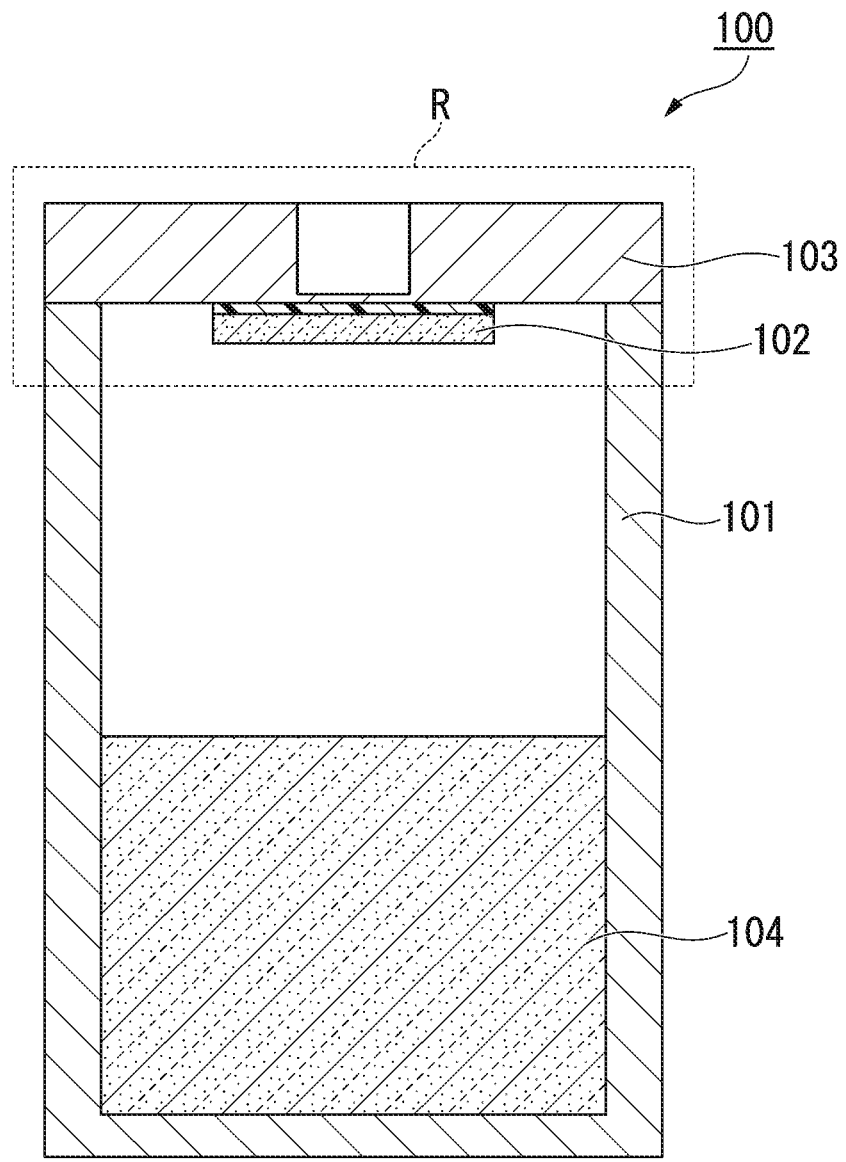
FIG. 1 is a longitudinal sectional diagram of a SiC single crystal manufacturing apparatus having a pedestal according to a first embodiment of the present invention.

FIG. 1 is a cross-sectional diagram of a SiC single crystal manufacturing apparatus 100 having a pedestal according to a first embodiment of the present invention. The SiC single crystal manufacturing apparatus 100 has at least a crucible 101 and a pedestal (support member) 103 supporting a seed (seed crystal) 102 for growing a crystal disposed on one end side of the inside of the crucible 101 and contains a raw material 104 on the other end side of the inside of the crucible 101. The SiC single crystal manufacturing apparatus 100 may further have a coil surrounding the outer wall of the crucible 101 and a taper guide (a cylindrical member) that is arranged in the crucible 101 so as to extend from the pedestal 103 side to the raw material 104 side and guide a sublimated gas to a position of the seed 102.

Figure 2A:
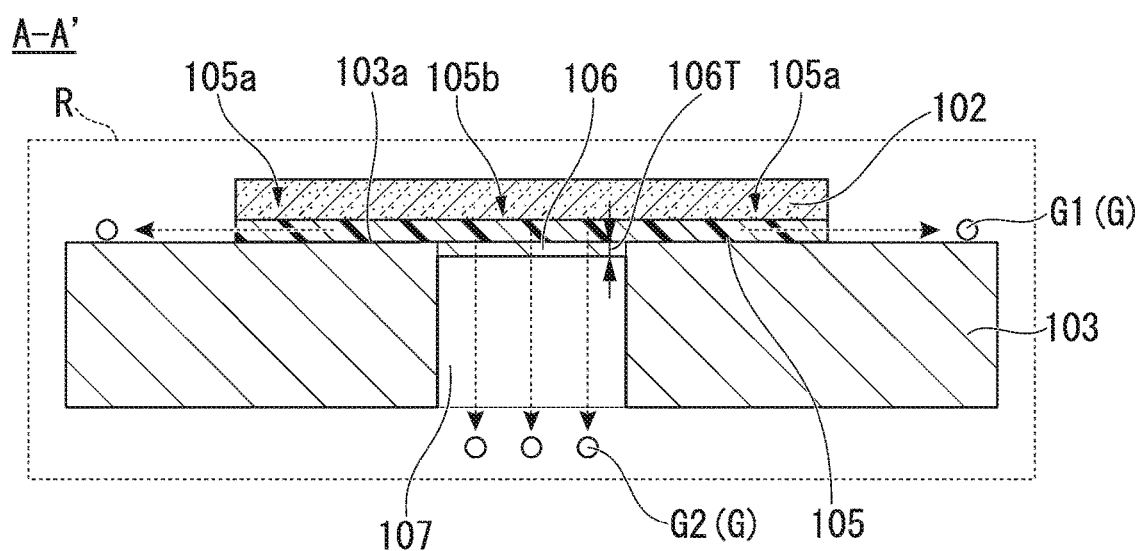
FIG. 2A is a diagram in which a region around the pedestal of the SiC single crystal manufacturing apparatus of FIG. 1 is enlarged.

FIG. 2A is an enlarged diagram of a region R around the pedestal 103 of the SiC single crystal manufacturing apparatus 100 of FIG. 1. The seed 102 is set to adhere (be fixed) to one main surface 103a side of the pedestal 103 (the raw material 104 side in FIG. 1) having a layer (adhesive layer) 105 made of an adhesive interposed therebetween.

As a material of the pedestal 103, a member made of a carbon molding material using graphite as the main raw material, porous carbon, glassy carbon, or other carbon-based materials may be used. As the adhesive, for example, a carbon adhesive including an organic solvent, or the like, is used.

In the process of causing the seed 102 to adhere to the pedestal 103, the adhesive applied to the pedestal 103 needs to be heated and cured, and a gas G is generated from the heated adhesive. The gas G is at least included in adhesives that are generally used, and mainly includes benzene, phenol, or the like.

The pedestal 103 has one flat main surface 103a to which the seed 102 adheres and has a region 106 that is formed to have a locally thin thickness from the one main surface 103a into which the gas easily permeates (gas-permeable region). That is, the pedestal has a gas-permeable region 106 which a thickness from the one main surface 103a is formed to be locally thin. That is, the gas-permeable region 106 is formed to be thinner than other regions. The thickness 106T of the gas-permeable region 106 is preferably 1 mm or more and less than 5 mm.

A space (cavity) 107 is formed immediately below the gas-permeable region 106 (the side opposite to the raw material 104 in FIG. 1) and is surrounded by regions formed to be thicker than the gas-permeable region 106 into which it is difficult for the gas to permeate. The space 107 can be regarded as a concavity (hole) when it is viewed from the other main surface 103b side of the pedestal.

Although the space 107 may have a shape that allows it to communicate with the outside, it preferably has a less curved shape, and more preferably has a shape extending in the thickness direction of the pedestal 103 from the viewpoint of smooth gas flow. In FIG. 2A, the space 107 linearly extending in the thickness direction of the pedestal 103 is exemplified.

In a case where the thickness 106T of the gas-permeable region 106 is less than 1 mm, the adhesive oozes out from the gas-permeable region 106 together with the gas, thus a region with little adhesive is formed, and thereby the adhesiveness of the seed to the pedestal deteriorates. In addition, in this case, cracks may occur or the flatness of the one main surface 103a may be easily lost, which may disturb the growth of a crystal. Further, in a case where the thickness 106T is 5 mm or more, the gas permeability thereof becomes lower, which makes it difficult to remove the target gas included in the adhesive layer 105, and as a result, the effect of preventing the occurrence of a macro defect decreases.

An average thickness of the region other than the gas-permeable region 106 of the adhesive layer 105 (non-gas-permeable region) exceeds 5 mm, and the region preferably includes a part having a thickness of 10 mm or thicker from the viewpoint of maintaining strength as a support member for the seed. The part having a thickness of 10 mm or thicker preferably occupies 20% or more of the non-gas-permeable region.

Figure 2B:
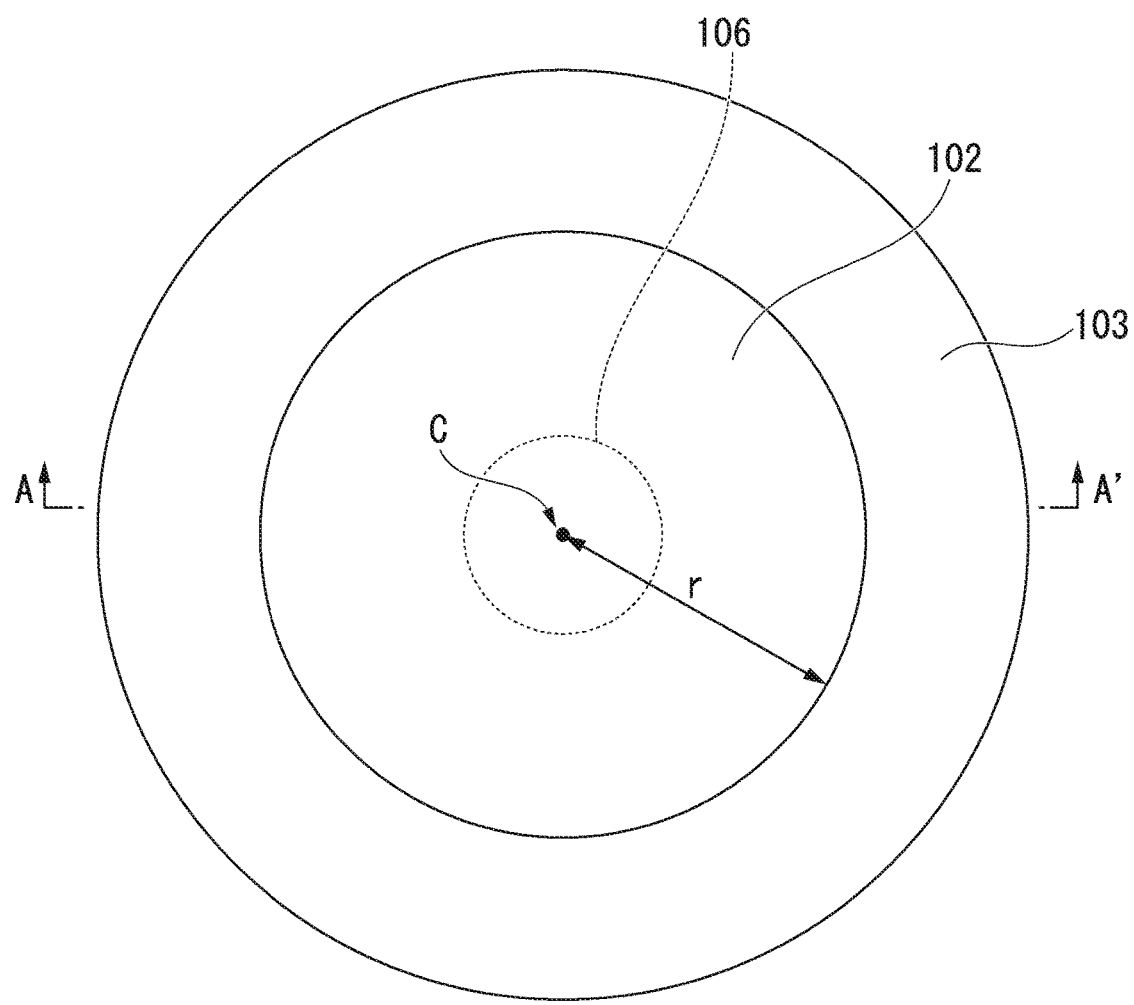
FIG. 2B is a diagram of the pedestal of FIG. 2A in plan view from above the seed.

FIG. 2B is a diagram of the pedestal 103 of FIG. 2A in plan view from above the seed 102. FIG. 2A is a cross-sectional diagram illustrating the pedestal 103 and the seed 102 of FIG. 2B cut at the position of the line A-A'.

Although a gas G1 generated near an outer circumferential part 105a of the adhesive layer 105 is emitted from the sides (a direction perpendicular to the thickness direction), a gas G2 generated near a center part 105b does not flow to the sides and is likely to remain. After the residual gas is removed, the gas-permeable region 106 is preferably disposed in the region near the bottom of the center part 105b, specifically, when the distance from a center C to an outer circumference is set to r, the region where the distance from the center C is r/2 or less, and more preferably disposed in the region where the distance is r/4 or less (in the present specification, the centers of the seed, the adhesive layer, and the pedestal in plan view in the thickness direction will be collectively referred to as the center C).

In the plan view of FIG. 2B, an area of the gas-permeable region 106 is preferably in the range of 1% to 80% of the area of the seed 102. In a case where an area of the gas-permeable region is greater than 80% of the area of the seed 102, it may be difficult to maintain the flatness of the pedestal 103 since the proportion of the thin part becomes higher. In a case where an area of the gas-permeable region is smaller than 1% of the area of the seed 102, the gas permeability deteriorates, and thus the effect of preventing the occurrence of a macro detect decreases.

[SiC Single Crystal Manufacturing Method]

A SiC single crystal manufacturing method using the pedestal 103 of the present embodiment will be described.

First, the adhesive layer 105 is formed by applying an adhesive to a part of the one main surface 103a of the pedestal of the present embodiment on which the seed 102 is to be placed. Then, the seed is adhered on the adhesive layer 105.

In that state, the adhesive layer 105 is heated, and the adhesive in the adhesive layer 105 is cured (a heating step). The heating temperature is preferably set in a range of about 200° C. to 2000° C., and the heating time is preferably set to a total of about 3 hours (hr) to 100 hr.

Although gases are generated inside the adhesive layer 105 during the heating, it is possible to cause the generated gases to be automatically emitted to the outside via the gas-permeable region according to a configuration of the present embodiment.

In the heating step, the seed 102 may be pressed to the pedestal 103 side by imposing a load on the seed 102. Accordingly, the gases in the adhesive layer 105 that are the cause of the formation of a macro detect can be forced out to the outside. The load in this case is preferably about 6 g/cm$^2$ or more.

Next, as illustrated in FIG. 1, the pedestal 103 on which the seed 102 has been adhered is installed such that the seed 102 is exposed to the inner space of the crucible 101 and the space 107 coming in contact with the gas-permeable region 106 is connected to the outer space of the crucible 101. In this state, the crucible 101 is heated using a heating means such as a coil. Accordingly, a raw material gas is generated from the raw material 104, and the raw material gas is supplied to the seed 102 adhered on the pedestal 103. Since the raw material gas is supplied to the seed 102, a SiC single crystal grows on the surface of the seed 102, and an ingot of the SiC single crystal is formed.

Further, after the gases of the adhesive layer 105 are emitted, the space 107 may be filled with a predetermined member (a filling step) to prevent the presence of the space 107 from affecting the temperature environment of the crystal growth. The filling member is preferably a member having the same properties as the constituent member of the pedestal 103.

As described above, the pedestal 103 according to the present embodiment has the gas-permeable region 106 that is formed to be locally thin. For this reason, in the state in which the seed 102 is fixed thereto with the adhesive, the gas G generated from the adhesive when the adhesive is heated and cured can be removed by emitting it to the outside via the gas-permeable region 106.

Therefore, the number of macro defects extending from vacancies caused by the gas G can be reduced, and deteriorating adhesiveness between the pedestal 103 and the seed 102 caused by the macro defects can be curbed. As a result, it is possible to prevent the growing SiC single crystal and the seed 102 from being detached from the pedestal 103 and to obtain a high-quality SiC single crystal little affected by the influence of macro defects.

Since the pedestal 103 of the present embodiment has the region other than the gas-permeable region 106 having a thickness exceeding 5 mm, it is possible to avoid the problems of the occurrence of cracks, loss of flatness of the one main surface 103a to which the seed 102 adheres, and the like.

Second Embodiment

Figure 3A:
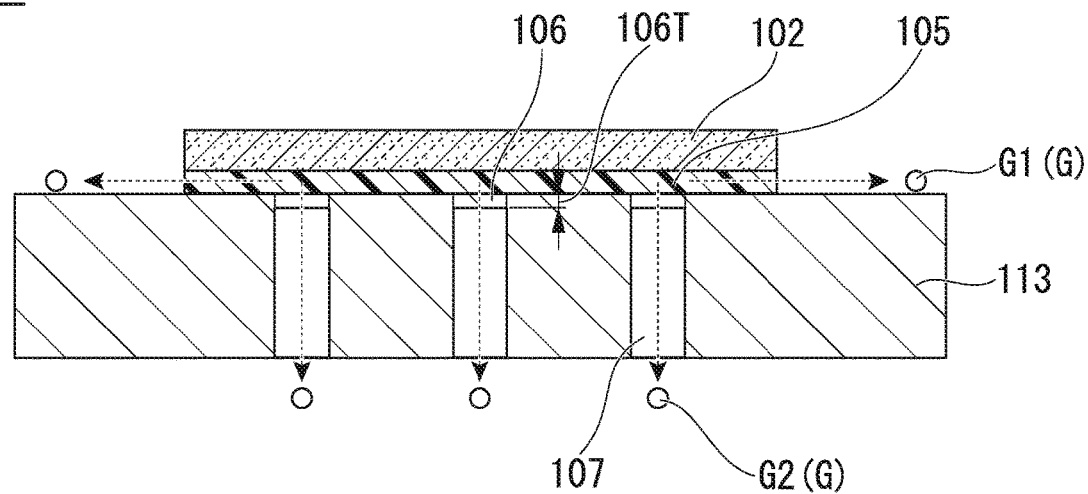
FIG. 3A is a cross-sectional diagram schematically showing a configuration of the vicinity of a pedestal according to a second embodiment of the present invention when the pedestal is used.

FIG. 3A is a cross-sectional diagram schematically illustrating a configuration around a pedestal 113 according to a second embodiment of the present invention similarly to FIG. 2A in a case where the pedestal 113 is used. The pedestal 113 of the present embodiment has a plurality of gas-permeable regions 106 that are formed to be locally thin. Other configurations of the second embodiment are similar to those of the first embodiment, and the parts corresponding to those of the first embodiment are shown with the same reference numerals regardless of differences in form. In the present embodiment, at least similar effects to those of the first embodiment can be obtained.

In a case where the plurality of gas-permeable regions 106 are disposed to increase the area of the gas-permeable region, the gas-permeable region can be enlarged accordingly in proportion thereto, which is preferable. However, from the viewpoint of achieving both flatness and gas permeability, a total area of the plurality of gas-permeable regions 106 is preferably in the range of 1% to 80% of the area of the seed 102.

If the gas-permeable regions 106 are disposed at a plurality of locations in a distributed manner, stress such as tension concentrated at each location resulting from change in a thermal environment or the like can be reduced. Thus, if the total area of the plurality of gas-permeable regions 106 is the same as the area of the gas-permeable region 106 of the first embodiment, the pedestal 113 of the present embodiment has the same maximum gas permeation amount, but can have a higher strength than that of the pedestal 103 of the first embodiment since stress is distributed.

Figure 3B:
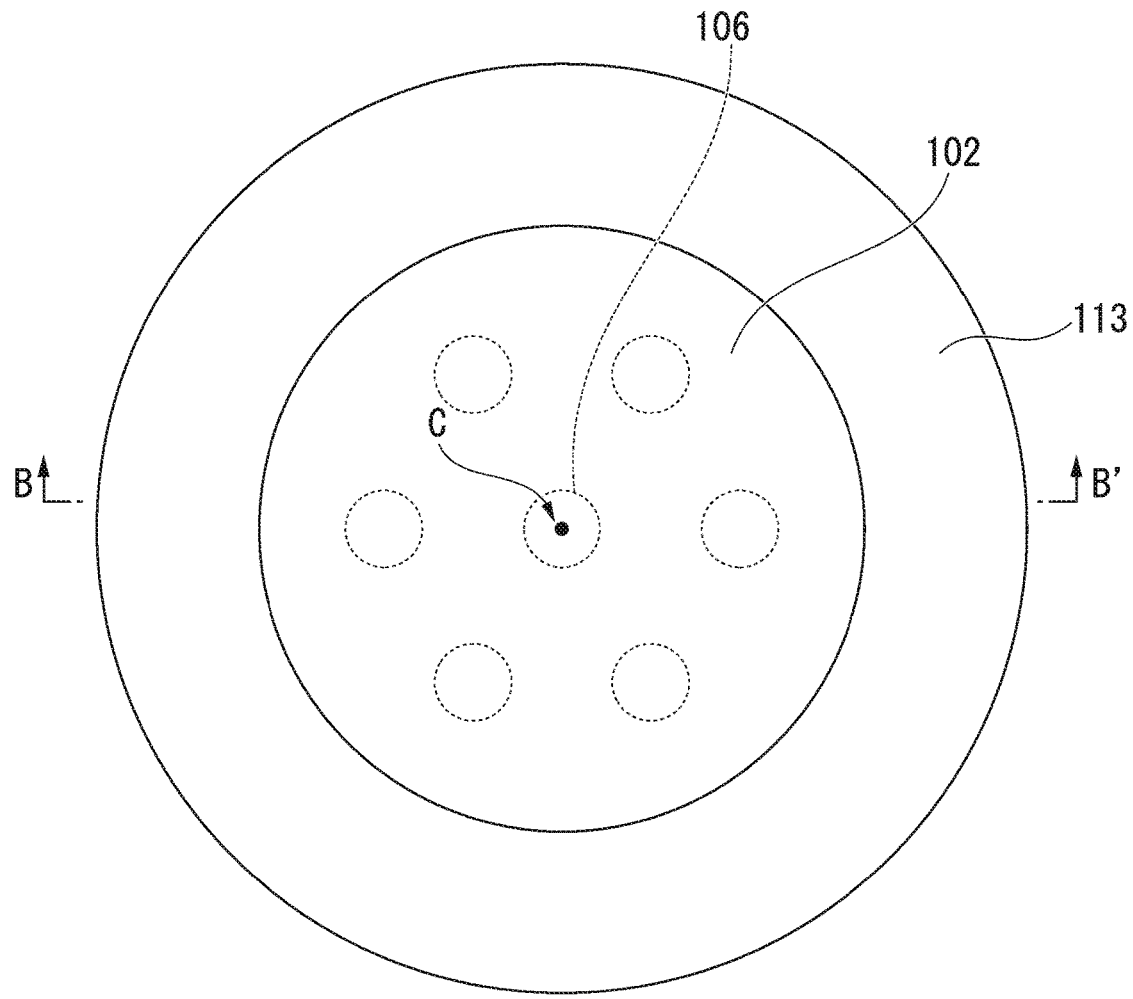
FIG. 3B is a diagram of the pedestal of FIG. 3A in plan view from above the seed.

FIG. 3B is a plan diagram in which the pedestal 113 of the present embodiment is viewed on a one main surface 113a side. FIG. 3A is a cross-sectional diagram illustrating the pedestal 113 and the seed 102 of FIG. 3B cut at the position of the line B-B'.

From the viewpoint of causing the gas inside the adhesive layer 105 to efficiently permeate into the region, the viewpoint of uniformly reducing the amount of gas inside the adhesive layer 105 in the entire region, the viewpoint of eliminating anisotropy of stress applied to the pedestal 113, and the like, the gas-permeable regions 106 are preferably disposed to have high symmetry with respect to the center C of the one main surface 113a in the circumferential direction. For such disposition, for example, disposition at positions of a plurality of vertices forming a regular polygon (a regular hexagon in FIG. 3B) and the position of the center point of the regular polygon is exemplified. The center point of the regular polygon of this case corresponds to the center C of the one main surface 113a.

Further, since the gas generated near a center part 105b of the adhesive layer is emitted to a side in a small amount, a residual amount thereof can easily become higher than that of the gas generated in an outer circumferential part 105a. Therefore, it is more preferable to widen the gas-permeable region overlapping the surroundings of the center part 105b than the gas-permeable region overlapping the surroundings of the outer circumferential part 105a from the viewpoint of reducing the gas inside the adhesive layer 105 uniformly in the entire region.

In the configuration of the first embodiment, the gas G1 generated near the outer circumferential part of the adhesive layer 105 during the crystal growth is emitted from the side and introduced into the crucible 101. On the other hand, in the present embodiment, since the gas-permeable regions 106 are also formed at the position overlapping the surroundings of the outer circumferential part of the adhesive layer 105, at least some of the gas G1 generated near the outer circumferential part 105a can be discharged to the outside of the crucible 101 via the gas-permeable regions 106. As a result, the amount of the gas G1 to be introduced from the side of the adhesive layer 105 into the crucible 101 during the crystal growth can be reduced, and thus the influence of the gas G1 on the crystal growth can be minimized.

Third Embodiment

Figure 4A:
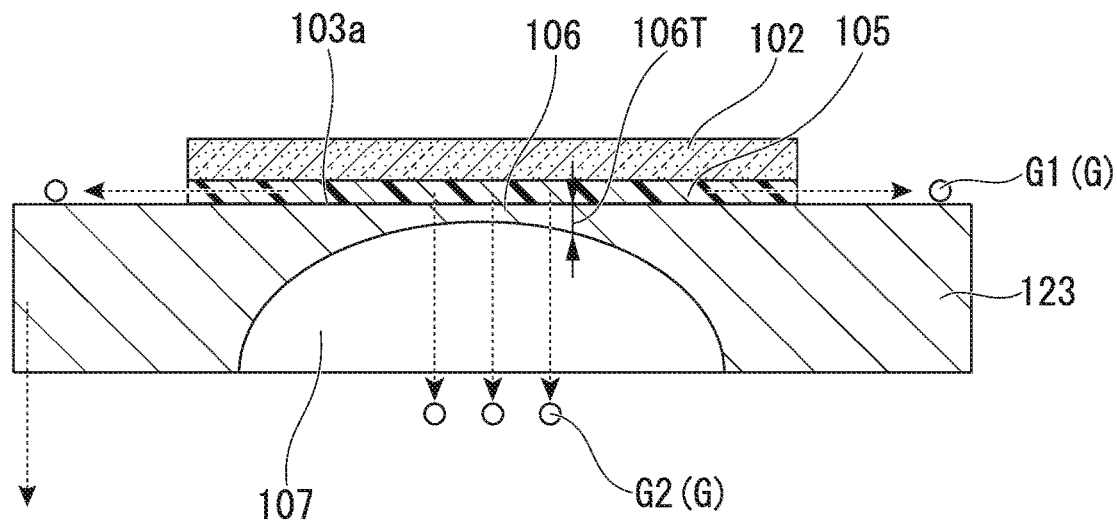
FIG. 4A is cross-sectional diagrams schematically illustrating a configuration of a vicinity of a pedestal according to a third embodiment of the present invention when the pedestal is used.
Figure 4B:
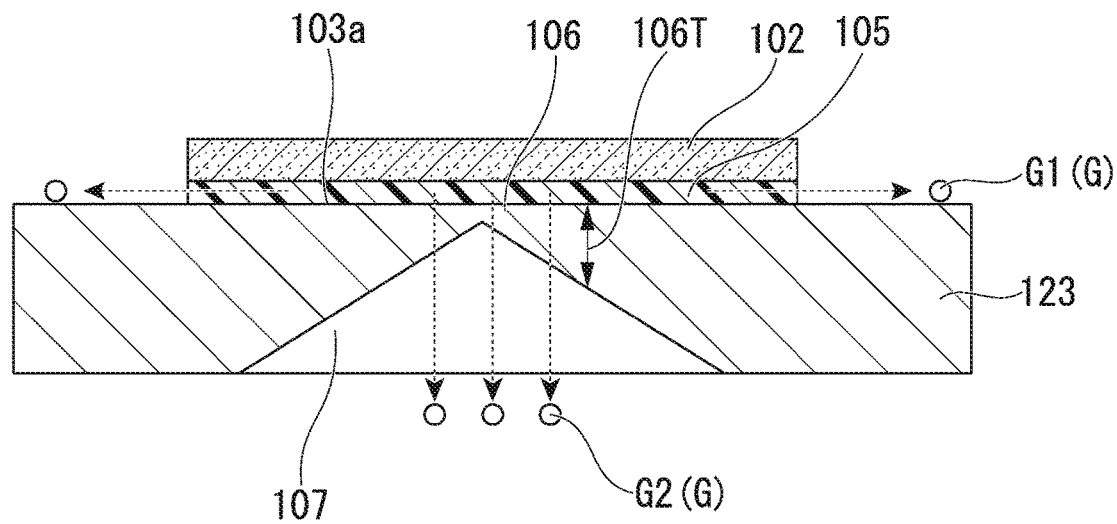
FIG. 4B is cross-sectional diagrams schematically illustrating a configuration of a vicinity of a pedestal according to a third embodiment of the present invention when the pedestal is used.

FIGS. 4A and 4B are cross-sectional diagrams schematically illustrating configurations in the vicinity of a pedestal 123 according to a third embodiment of the present invention similarly to FIG. 2A when the pedestal 123 is used. In the pedestal 123 of the present embodiment, a thickness 106T of a gas-permeable region increases in the thickness direction as the distance from the center C thereof increases in plan view. The thickness 106T may increase continuously or discontinuously. In this case, more gas is allowed to permeate into the region in the vicinity of the relatively thin center part.

Further, in a case where the thickness 106T of the gas-permeable region decreases as the distance from the center C decreases, more gas is allowed to permeate into the region in the vicinity of the relatively thin outer circumferential part. Other configurations of the third embodiment are similar to those of the first embodiment, and the parts corresponding to those of the first embodiment are shown with the same reference numerals regardless of differences in form. In the present embodiment, at least similar effects to those of the first embodiment can be obtained.

FIG. 4A illustrates a case in which the thickness 106T increases continuously and the surface 106b of the gas-permeable region 106 opposite to the seed 102 moves away from the one main surface 103a proportional to the distance from the center C while gently curving in cross-sectional view.

FIG. 4B illustrates a case in which the thickness 106T continuously increases and the surface 106b of the gas-permeable region 106 opposite to the seed 102 moves away from the one main surface 103a proportional to the distance from the center C while linearly inclining in cross-sectional view.

Figure 5A:
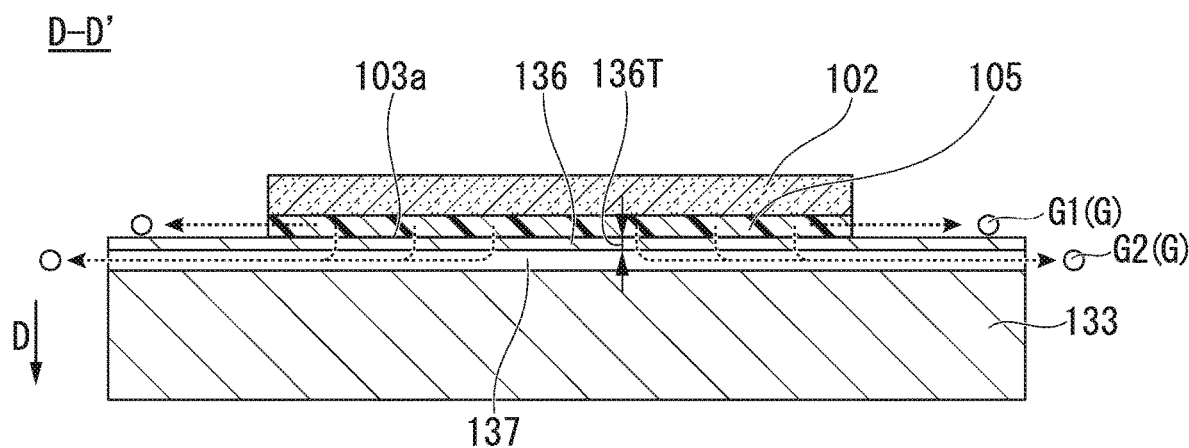
FIG. 5A is a cross-sectional diagram schematically illustrating a configuration of a vicinity of a pedestal according to a fourth embodiment of the present invention when the pedestal is used.

In the present embodiment, a space 107 coming in contact with the gas-permeable region 106 becomes wider as it moves away from the gas-permeable region 106. Therefore, the interaction (pressure) of the gases G1 emitted from the gas-permeable region 106 becomes weaker as the space moves away from the gas-permeable region 106. For this reason, the gases G1 emitted from the gas-permeable region 106 are caused to move away from the gas-permeable region 106 with higher efficiency. As a result, the permeation of the gas G1 in the thickness direction of the gas-permeable region 106 may be promoted with a higher probability Fourth Embodiment FIG. 5A is a cross-sectional diagram schematically illustrating a configuration around a pedestal 133 according to a fourth embodiment of the present invention similarly to FIG. 2A when the pedestal 133 is used. The pedestal 133 of the present embodiment differs from the pedestal 103 of the first embodiment in that the shapes of the gas-permeable region 106 and the space 107 are different. In the present embodiment, gas-permeable regions 136 are spreading (extending) in a depth direction D from the one main surface 133a, has a specified thickness, and transmit a gas in the depth direction D. The gas-permeable regions 136 has a space 137 communicating with the outside and provided on the inner side of the gas-permeable regions 136. Other configurations of the fourth embodiment are similar to those of the first embodiment, and the parts corresponding to those of the first embodiment are shown with the same reference numerals regardless of differences in form.

In the present embodiment, the region between the space 137 and the one main surface 133a serves as the gas-permeable regions 136. The space 137 is preferably formed at a distance (depth) of 1 mm or more to less than 5 mm from the one main surface 133a. That is, a thickness 136T of the gas-permeable regions is preferably 1 mm or more and less than 5 mm.

In a case in which the thickness 136T of the gas-permeable regions is less than 1 mm, an adhesive oozes out from the gas-permeable regions 136 together with a gas, then a region with little adhesive may be formed, and the adhesiveness between the pedestal and the seed may deteriorate. In addition, in this case, cracks may occur or the flatness of the one main surface 133a may be easily lost, which may disturb the crystal growth. Further, in a case where the thickness 136T is 5 mm or more, gas permeability becomes lower, which makes it difficult to remove the gas included in the adhesive layer 105, and as a result, the effect of preventing the occurrence of a macro defect decreases.

Although the space 137 may communicate with the outside of the pedestal 133 at least one location, if the space 137 communicates with the outside at two locations as illustrated in FIG. 5A and the two locations open to each other, the flow of the gas toward the outside becomes smoother, which is preferable.

Figure 5B:
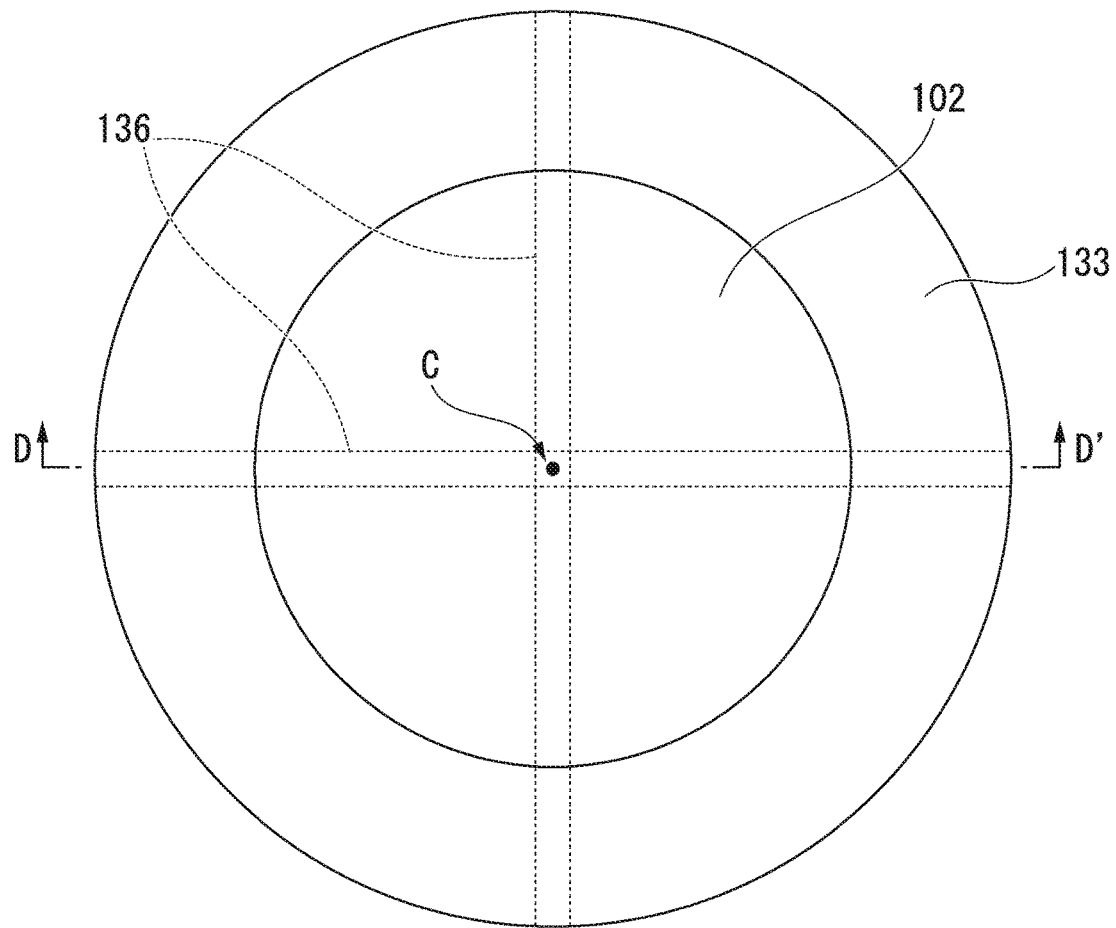
FIG. 5B is a diagram of the pedestal of FIG. 5A in plan view from above the seed.

FIG. 5B is a plan diagram in which the pedestal 133 of the present embodiment is viewed on the one main surface 133a side. FIG. 5A is a cross-sectional diagram of the pedestal 133 and the seed 102 of FIG. 5B cut at the position of the line D-D'. Here, a case where the gas-permeable regions 136 form a cross shape extending in four directions from the center C and the space 137 extending along the gas-permeable regions 136 forms two through-holes is exemplified.

More through-holes and a greater inner diameter of the through-holes are preferable from the viewpoint of emitting the gas to the outside with good efficiency. However, if the number of through-holes and the inner diameter of the through-holes are excessive, it becomes difficult to maintain the strength of the pedestal 133 since the proportion of formed cavities increases, and further the flatness of the one main surface 133*a* is easily lost. Therefore, the number and inner diameter of through-holes to be formed need to be determined taking the size of the pedestal to be used and the like into consideration.

The through-holes are preferably disposed to be symmetric with respect to the center C of the one main surface 133*a* of the pedestal. In a case where there are a plurality of through-holes, it is preferable for the plurality of through-holes to intersect with each other at the center C so that the gas-permeable regions 136 are concentrated at a position overlapping the center part of the adhesive layer 105 in which a gas is likely to remain. That is, the plurality of through-holes are preferably formed to radially extend from the center C.

From the viewpoint of causing the gas inside the adhesive layer 105 to efficiently permeate into the region, the viewpoint of uniformly reducing the amount of gas inside the adhesive layer 105 in the entire region, the viewpoint of eliminating anisotropy of stress applied to the pedestal 133, and the like, the gas-permeable regions 136 are preferably disposed to have high symmetry with respect to the center C of the one main surface 133*a* in the circumferential direction.

In the pedestal 133 of the present embodiment, the region immediately above (overlapping the space 137) a space present inside the pedestal 133 is formed to be thin, which serves as the gas-permeable region 136. Thus, in a state in which the seed 102 is fixed to the pedestal with the adhesive, a gas G generated from the adhesive when it is heated and cured can be removed by being emitted to the outside via the gas-permeable region 136 and the space 137.

Therefore, the number of macro defects extending from vacancies caused by the gas G can be reduced, and deteriorating adhesiveness between the seed 102 and the pedestal 103 caused by the macro defects can be curbed. As a result, it is possible to prevent the growing SiC single crystal and the seed 102 from being detached from the pedestal 133 and to obtain a high-quality SiC single crystal little affected by macro defects.

Since the region other than the gas-permeable region 136 has a thickness exceeding 5 mm in the pedestal 103 of the present embodiment, it is possible to avoid problems like generation of cracks, loss of flatness of the one main surface 103*a* to which the seed 102 adheres, and the like.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. A pedestal supporting a seed for crystal growth in a sublimation method,
wherein the pedestal is made of a carbon material,
the pedestal has a plate shape and has a first main surface and a second main surface,
the first main surface is flat to support the seed and the second main surface has a plurality of concavities,
a thickness of a portion of the pedestal with the concavities is 1 mm or more and less than 5 mm in a lowest area thereof,
a thickness of a portion of the pedestal without the concavities is 10 mm or more, and
in plan view from a thickness direction, one of the plurality of concavities is disposed at a center of the pedestal, a diameter of the one of the plurality of concavities being more than diameters of other ones of the plurality of concavities.

2. The pedestal according to claim 1, wherein, in the plan view from the thickness direction, when a distance from a center of the pedestal to an outer circumference thereof is set to r, the plurality of concavities are included in the range of the distance r/2 from the center of the pedestal.

3. A SiC single crystal manufacturing apparatus, comprising: the pedestal according to claim 1.

4. The pedestal according to claim 1,
wherein the concavities are disposed to overlap a center of the first main surface and to be symmetrical with respect to the center of the first main surface in the circumferential direction.

5. The pedestal according to claim 1,
wherein a portion of the plurality of concavities overlaps a central portion of the first main surface and portions of the plurality of concavities, other than the portion thereof which overlaps the central portion of the first main surface, overlap an outer circumferential part of the first main surface, the outer circumferential part of the first main surface being disposed on an outside circumference of the central portion thereof.

6. The pedestal according to claim 1,
wherein a portion of the plurality of the concavities overlaps a center portion of the first main surface and portions of the plurality of the concavities, other than the portion thereof which overlaps the central portion of the first main surface, overlap an outer circumferential part of the first main surface, the outer circumferential part of the first main surface being disposed on an outside circumference of the central portion thereof, and
wherein, the portion of the plurality of concavities which overlaps the center portion of the first main surface is wider than the portions of the plurality of the concavities which overlap the outer circumferential part of the first main surface.

7. The pedestal according to claim 1,
wherein a portion of the plurality of concavities overlaps a center portion of the first main surface and portions of the plurality of concavities, other than the portion thereof which overlaps the central portion of the one first main surface, overlap an outer circumferential part of the first main surface, the outer circumferential part of the first main surface being disposed on an outside circumference of the central portion thereof,
wherein, the portion of the plurality of concavities which overlaps the center portion of the first main surface is wider than the portions of the plurality of concavities which overlap the outer circumferential part of the first main surface, and
wherein, the portion of the plurality of concavities overlapping the center portion of the first main surface is disposed to overlap the center of the first main surface and the portions of the plurality of concavities overlapping the outer circumferential part of the first main surface is disposed to be symmetrical with respect to the center of the first main surface in the circumferential direction.

8. The pedestal according to claim 4,
wherein the plurality of concavities are disposed in a hexagonal shape.

\* \* \* \* \*